(12) United States Patent
Kong et al.

(10) Patent No.: US 12,295,247 B2
(45) Date of Patent: *May 6, 2025

(54) DISPLAY PANEL AND MANUFACTURING METHOD THEREOF, AND DISPLAY DEVICE

(71) Applicant: BOE TECHNOLOGY GROUP CO., LTD., Beijing (CN)

(72) Inventors: Xiangyong Kong, Beijing (CN); Dongfang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/591,430

(22) Filed: Feb. 29, 2024

(65) Prior Publication Data

US 2024/0206308 A1    Jun. 20, 2024

Related U.S. Application Data

(60) Continuation of application No. 17/169,099, filed on Feb. 5, 2021, now Pat. No. 11,950,490, which is a
(Continued)

(30) Foreign Application Priority Data

Nov. 11, 2013   (CN) .......................... 201310557149.5

(51) Int. Cl.
*H10K 71/50* (2023.01)
*H10K 50/125* (2023.01)
(Continued)

(52) U.S. Cl.
CPC ........... *H10K 71/50* (2023.02); *H10K 50/125* (2023.02); *H10K 50/818* (2023.02);
(Continued)

(58) Field of Classification Search
CPC .................. H10K 50/824; H10K 50/8428
See application file for complete search history.

(56) References Cited

U.S. PATENT DOCUMENTS

| 2004/0031959 A1 | 2/2004 | Park et al. |
| 2004/0185604 A1 | 9/2004 | Park et al. |
(Continued)

FOREIGN PATENT DOCUMENTS

| CN | 1543269 A | 11/2004 |
| CN | 1691846 A | 11/2005 |
(Continued)

OTHER PUBLICATIONS

PCT International Search Report for Application No. PCT/CN2014/082240.
(Continued)

*Primary Examiner* — Kevin Parendo
(74) *Attorney, Agent, or Firm* — Nath, Goldberg & Meyer; Joshua B. Goldberg

(57) ABSTRACT

The disclosure provides a display panel and a display device. The display panel includes a first substrate and a second substrate, the second substrate has an organic electroluminescent device, an anode layer of the organic electroluminescent device is away from the first substrate and a cathode layer thereof is closer to the first substrate than the anode layer; the cathode layer is electrically connected to an auxiliary electrode on a light entering surface of the first substrate through multiple conductive spacers, the cathode layer is a transparent electrode layer; the auxiliary electrode has a resistance smaller than that of the cathode layer of the organic electroluminescent device; the auxiliary electrode is a grid-shaped auxiliary electrode and in a non-display region, the auxiliary electrode is opaque; the multiple conductive spacers includes first conductive spacers on the
(Continued)

auxiliary electrode and second conductive spacers on the cathode layer of the second substrate.

20 Claims, 3 Drawing Sheets

Related U.S. Application Data division of application No. 16/393,153, filed on Apr. 24, 2019, now Pat. No. 10,950,793, which is a continuation of application No. 14/422,271, filed as application No. PCT/CN2014/082240 on Jul. 15, 2014, now Pat. No. 10,411,189.

(51) Int. Cl.
  *H10K 50/818* (2023.01)
  *H10K 50/824* (2023.01)
  *H10K 50/828* (2023.01)
  *H10K 50/842* (2023.01)
  *H10K 50/856* (2023.01)
  *H10K 59/38* (2023.01)
  *H10K 71/00* (2023.01)
  *H10K 102/00* (2023.01)

(52) U.S. Cl.
  CPC ......... *H10K 50/824* (2023.02); *H10K 50/828* (2023.02); *H10K 50/8428* (2023.02); *H10K 50/856* (2023.02); *H10K 71/00* (2023.02); *H10K 71/621* (2023.02); *H10K 59/38* (2023.02); *H10K 2102/3026* (2023.02)

(56) References Cited

U.S. PATENT DOCUMENTS

| | | | |
|---|---|---|---|
| 2004/0227459 A1 | 11/2004 | Imura | |
| 2005/0051776 A1 | 3/2005 | Miyagi et al. | |
| 2005/0140287 A1 | 6/2005 | Ko | |
| 2005/0212413 A1 | 9/2005 | Matsuura et al. | |
| 2007/0108899 A1 | 5/2007 | Jung et al. | |
| 2010/0097295 A1 | 4/2010 | Kwak | |
| 2014/0217397 A1 | 8/2014 | Kwak | |

FOREIGN PATENT DOCUMENTS

| | | | |
|---|---|---|---|
| CN | 1967864 A | 5/2007 | |
| CN | 101728419 A | 6/2010 | |
| CN | 103545345 A | 1/2014 | |
| KR | 20050024033 A | 3/2005 | |
| WO | 2013062059 A1 | 5/2013 | |

OTHER PUBLICATIONS

Notification of the First Office Action dated Jul. 15, 2015 corresponding to Chinese application No. 201310557149.5.
Written Opinion of the International Searching Authority dated Oct. 21, 2014 corresponding to International application No. PCT/CN2014/082240.
2nd Office Action issued in Chinese application No. 201310557149.5 dated Dec. 29, 2015.
Notice of Allowance dated Jan. 3, 2024 corresponding to U.S. Appl. No. 17/169,099.
Non-Final Rejection dated Jan. 20, 2023 corresponding to U.S. Appl. No. 17/169,099.
Final Office Action dated Oct. 12, 2016 corresponding to U.S. Appl. No. 14/422,271.
Advisory Action dated Dec. 23, 2016 corresponding to U.S. Appl. No. 14/422,271.
Restriction Requirement dated Feb. 4, 2016 corresponding to U.S. Appl. No. 14/422,271.
Non-Final Office Action dated Jun. 20, 2018 corresponding to U.S. Appl. No. 14/422,271.
Final Office Action dated May 9, 2016 corresponding to U.S. Appl. No. 14/422,271.
Ex Parte Qualye Action dated Dec. 4, 2018 corresponding to U.S. Appl. No. 14/422,271.
Non-Final Office Action dated Oct. 28, 2020 corresponding to U.S. Appl. No. 16/393,153.
Notice of Allowance dated Apr. 30, 2019 corresponding to U.S. Appl. No. 14/422,271.
Non-Final Office Action dated Jun. 29, 2020 corresponding to U.S. Appl. No. 16/393,153.
Notice of Allowance dated Dec. 2, 2020 corresponding to U.S. Appl. No. 16/393,153.

DISPLAY PANEL AND MANUFACTURING METHOD THEREOF, AND DISPLAY DEVICE

FIELD OF THE INVENTION

The present disclosure relates to the field of the display device manufacturing technology, and particular to a display panel and a manufacturing method thereof, and a display device.

BACKGROUND OF THE INVENTION

In recent years, the display technology has been developed rapidly, and especially the organic electroluminescent device (OLED) display technology has been developed rapidly. Currently, there are mainly two kinds of technologies for colorizing large-sized white organic electroluminescent devices (WOLEDs), one of which is to form a display panel by directly manufacturing color filter patterns on a second substrate (COA, color filter on array), and the other of which is to form a display panel by assembling a first substrate and a second substrate, and providing spacers arranged spaced at certain intervals between the first substrate and the second substrate, wherein the spacers are used to support the first substrate and the second substrate.

SUMMARY OF THE INVENTION

An embodiment of the present disclosure provides a manufacturing method of a display panel, including steps of: forming a pattern including an auxiliary electrode on a light entering surface of a first substrate by a patterning process; forming a pattern including conductive spacers on at least one of the auxiliary electrode and a cathode layer of a second substrate by a patterning process; and assembling the first substrate and a second substrate, so that the auxiliary electrode is electrically connected to a cathode layer of an organic electroluminescent device through the conductive spacers, wherein the cathode layer is a transparent electrode layer.

In some implementations, forming a pattern including conductive spacers on at least one of the auxiliary electrode and a cathode layer of a second substrate by a patterning process includes:
forming a pattern including conductive spacers on the auxiliary electrode by a patterning process.

In some implementations, forming a pattern including conductive spacers on at least one of the auxiliary electrode and a cathode layer of a second substrate by a patterning process includes:
forming a pattern including conductive spacers on the cathode layer of the second substrate at positions corresponding to the auxiliary electrode by a patterning process.

In some implementations, forming a pattern including conductive spacers on at least one of the auxiliary electrode and a cathode layer of a second substrate by a patterning process includes:
forming a pattern including first conductive spacers on the auxiliary electrode by a patterning process, and forming a pattern including second conductive spacers on the cathode layer of the second substrate at positions corresponding to the first conductive spacers by a patterning process.

In some implementations, assembling the first substrate and a second substrate, so that the auxiliary electrode is electrically connected to a cathode layer of an organic electroluminescent device through the conductive spacers includes:
assembling the first substrate and the second substrate, so that the auxiliary electrode is electrically connected to the cathode layer of the organic electroluminescent device through the first conductive spacers and the second conductive spacers.

In some implementations, the auxiliary electrode has a resistance smaller than that of the cathode layer of the organic electroluminescent device.

In some implementations, the conductive spacers are made of any one of polyacetylene, PPV, polythiophene, poly p-phenylene, polypyrrole, polyaniline, poly(3,4-ethylenedioxythiophene) or combination thereof.

In some implementations, a surface area of an end of the first conductive spacer facing the second conductive spacer is smaller than that of an end of the second conductive spacer facing the first conductive spacer.

In some implementations, the auxiliary electrode is formed as a plate-shaped auxiliary electrode which is transparent and conductive.

In some implementations, the plate-shaped auxiliary electrode is made of any one of indium tin oxide, indium gallium zinc oxide, and indium zinc oxide.

In some implementations, the auxiliary electrode is formed as a grid-shaped auxiliary electrode and provided in a non-display region.

In some implementations, the grid-shaped auxiliary electrode is made of any one of Al, Mo, Cu, Ag, Cr and Au or a combination thereof.

In some implementations, the manufacturing method further including: forming a reflective layer below an anode layer of the organic electroluminescent device, and the reflective layer is configured to reflect light emitted from the organic electroluminescent device to the cathode layer of the organic electroluminescent device.

An embodiment of the present disclosure provides a display panel including a first substrate and a second substrate which are assembled, wherein the second substrate is provided with an organic electroluminescent device thereon, an anode layer of the organic electroluminescent device is away from the first substrate and a cathode layer thereof is closer to the first substrate than the anode layer; the cathode layer of the organic electroluminescent device is electrically connected to an auxiliary electrode on a light entering surface of the first substrate through a plurality of conductive spacers spaced, and the cathode layer is a transparent electrode layer; and the auxiliary electrode has a resistance smaller than that of the cathode layer of the organic electroluminescent device; wherein the auxiliary electrode is a grid-shaped auxiliary electrode and is provided in a non-display region, and the auxiliary electrode is opaque and acts as a black matrix.

In some implementations, the grid-shaped auxiliary electrode is made of any one of Al, Mo, Cu, Ag, Cr and Au or a combination thereof.

An embodiment of the present disclosure provides display device including the above display panel.

An embodiment of the present disclosure provides display panel including a first substrate and a second substrate which are assembled, wherein the second substrate is provided with an organic electroluminescent device thereon, an anode layer of the organic electroluminescent device is away from the first substrate and a cathode layer thereof is closer to the first substrate than the anode layer; the cathode layer of the organic electroluminescent device is electrically connected to an auxiliary electrode on a light entering surface of the first substrate through a plurality of conductive spacers spaced, and the cathode layer is a transparent electrode layer; and the auxiliary electrode has a resistance smaller than that of the cathode layer of the organic electroluminescent device; wherein the auxiliary electrode includes a plurality of bar-shaped auxiliary electrodes connected to each other through at least one connection stripe.

In some implementations, the bar-shaped auxiliary electrode is made of any one of Al, Mo, Cu, Ag, Cr and Au or a combination thereof.

An embodiment of the present disclosure provides display device including the above display panel.

REFERENCE SIGNS

101 first substrate; 102 second substrate; 103 thin film transistor; 104 pixel electrode layer (anode layer); 105 light emitting layer; 106 cathode layer; 107 (conductive) spacer; 1071 first conductive spacer; 1072 second conductive spacer; 108 black matrix; 109 color filter pattern; 110 planarization layer; 111 (plate/grid-shaped) auxiliary electrode.

DETAILED DESCRIPTION OF EMBODIMENTS

In order to make persons skilled in the art better understand the solutions of the disclosure, the disclosure will be described below in detail in conjunction with drawings and embodiments.

Figure 1:
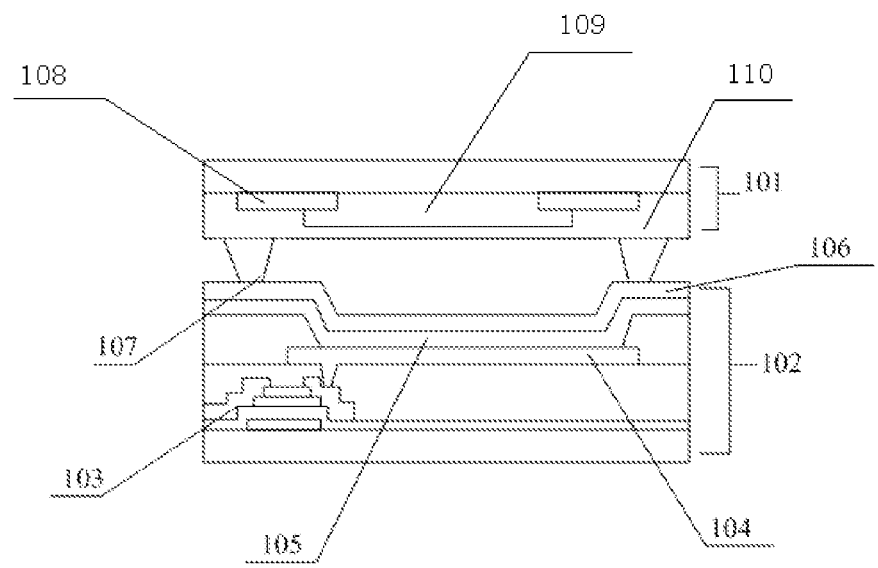
FIG. 1 is a structural diagram of a display panel in the prior art.
Figure 2:
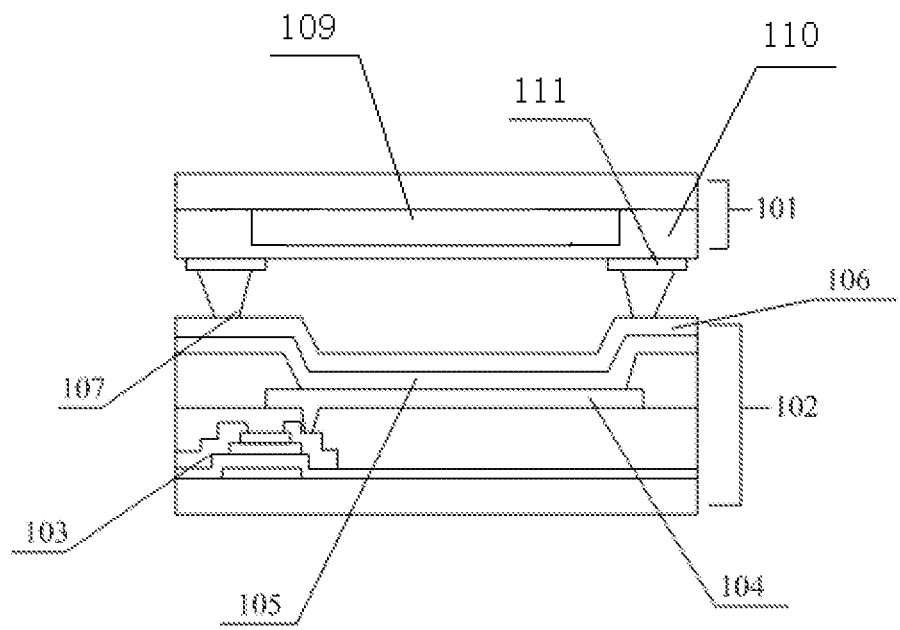
FIG. 2 is a structural diagram of a display panel according to embodiment 1 of the disclosure.

As shown in FIG. 1, for a display panel consisting of a second substrate 102 and a first substrate 101, the first substrate 101 includes black matrixes 108, color filter patterns 109 of various colors provided above the black matrixes 108, and a planarization layer 110 provided above the black matrixes 108 and the color filter patterns 109 of various colors; a drain of a thin film transistor 103 on the second substrate 102 is electrically connected to an anode layer 104 of an organic electroluminescent device, the anode layer 104 is provided at one side close to the second substrate 102, a cathode layer 106 of the organic electroluminescent device is provided at one side far away from the second substrate 102, a light emitting layer 105 is provided between the anode layer 104 and the cathode layer 106, and a plurality of organic electroluminescent devices are provide on the second substrate 102, the anode layers 104 of the organic electroluminescent devices are controlled by different thin film transistors 103 respectively, all of the cathode layers 106 are connected together, spacers 107 supports the first substrate 101 and the second substrate 102 therebetween, at this time, light emitted from the organic electroluminescent devices transmits the cathode layer 106, that is to say, the organic electroluminescent device is of a top-emitting type, the cathode layer 106 is commonly made of conductive material such as silver (Ag) and aluminium (Al), light transmission of which is low, thus it is required to select very thin conductive material so that light may transmit. It should be noted that, after the first substrate 101 and the second substrate 102 are manufactured separately, the first substrate 101 and the second substrate 102 are assembled to form a display panel, wherein the spacers 106 may formed on the first substrate 101 or on the second substrate 102.

The inventor finds that, in the organic electroluminescent device of top-emitting type adopted in the above display panel, the cathode layer 106 is thin due to requirement on transmittance, resulting in the fact that the cathode layer 106 has large resistance, and poor conductivity, therefore the light emitting performance of the organic electroluminescent device is poor, and the display effect is nonuniform.

Embodiment 1

As shown in FIGS. 2, 3, 4 and 5, the present embodiment provides a display panel, which comprises a first substrate 101 and a second substrate 102 which are assembled, the second substrate 102 is provided with organic electroluminescent devices thereon, an anode layer 104 of the organic electroluminescent device is far away from the first substrate 101 and an cathode layer 106 thereof is close to the first substrate 101; and the cathode layer 106 of the organic electroluminescent device is electrically connected to an auxiliary electrode 111 on a light entering surface of the first substrate 101 through a plurality of conductive spacers 107 spaced at certain intervals, wherein the cathode layer 106 is a transparent electrode layer.

The second substrate 102 of the display panel of the embodiment includes a plurality of organic electroluminescent devices, an anode layer 104 of each of the organic electroluminescent devices is separately controlled by a separated thin film transistor 103, cathode layers 106 of all of the organic electroluminescent devices are connected together, and the light entering surface of the first substrate 101 is provided with the auxiliary electrode 111, which is electrically connected to the cathode layers 106 of the organic electroluminescent devices through the conductive spacers 107 so as to improve the conductivity of the cathode layers 106, and thus improve the luminance uniformity of the display panel.

Preferably, the auxiliary electrode 111 has a resistance smaller than that of the cathode layer 106 of the organic electroluminescent device, thus an IR drop of the cathode layer 106 may be prevented or decreased, the conductivity of the cathode layer 106 is enhanced due to the auxiliary electrode, and thus the luminance uniformity of the display panel may be improved.

The conductive spacer 107 is preferably made of any one of polyacetylene, PPV, polythiophene, poly p-phenylene, polypyrrole, polyaniline, poly(3,4-ethylenedioxythiophene) or combination thereof. Of course, the disclosure is not limited thereto. The conductive spacer 107 may be made of any other material, so long as it is conductive and plays a supporting role.

Figure 5:
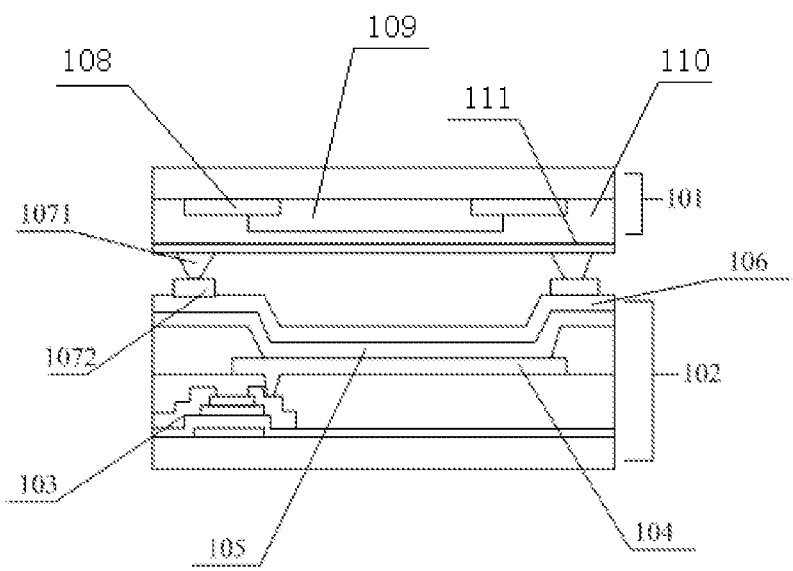
FIG. 5 is a structural diagram of a display panel manufactured by a manufacturing method of a display panel according to embodiment 4 of the disclosure.

The conductive spacer 107 may be of an integrated structure, and may be provided on the first substrate 101 or the second substrate 102 for supporting the first substrate 101 and the second substrate 102 when assembled. The conductive spacer 107 may preferably include, as shown in FIG. 5, a first conductive spacer 1071 and a second conductive spacer 1072 which are connected to each other, for example, the first conductive spacer 1071 is provided on the first substrate 101, and the second conductive spacer 1072 is provided on the second substrate 102, and a surface area of an end of the first conductive spacer 1071 towards the second conductive spacer 1072 is smaller than that of an end of the second conductive spacer 1072 towards the first conductive spacer 1071. At this time, compared to the integrated conductive spacer 107, the height of the first conductive spacer 1071 or the second conductive spacer 1072 is relatively small, therefore, the first conductive spacer 1071 and the second conductive spacer 1072 are easily manufactured, and since the surface area of an end of the first conductive spacer 1071 towards the second conductive spacer 1072 is smaller than that of an end of the second conductive spacer 1072 towards the first conductive spacer 1071, the first substrate 101 and the second substrate 102 are assembled more stably. It should be noted that, it is possible to make the surface area of an end of the first conductive spacer 1071 towards the second conductive spacer 1072 be larger than that of an end of the second conductive spacer 1072 towards the first conductive spacer 1071, and it can be easily conceived that the stability of the assemblage of the first substrate 101 and the second substrate 102 with the support of the first conductive spacer 1071 and the second conductive spacer 1072 can be ensured, so long as one of surface areas of contacting surfaces of the first conductive spacer 1071 and the second conductive spacer 1072 is made be larger than the other one.

The auxiliary electrode 111 is preferably a plate-shaped auxiliary electrode 111 which is transparent and conductive. The plate-shaped auxiliary electrode 111 is made of any one of indium tin oxide, indium gallium zinc oxide, and indium zinc oxide, and of course, other transparent materials are also possible.

Figure 3:
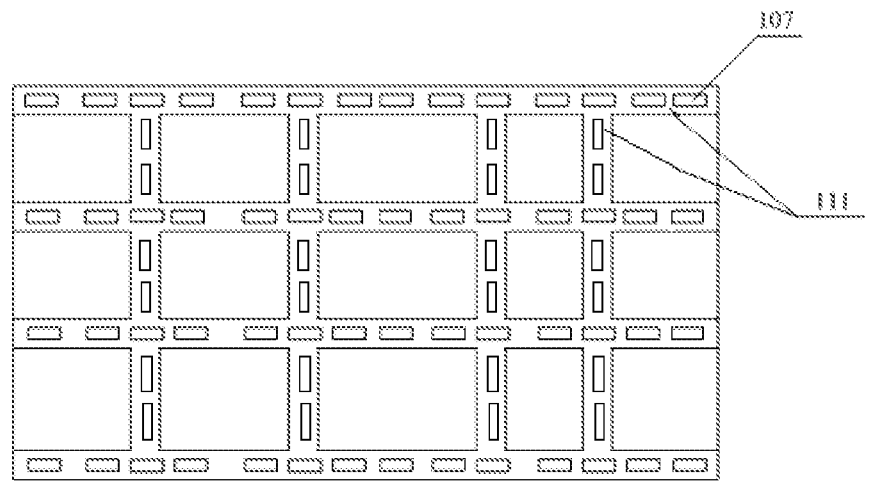
FIG. 3 a top view of an auxiliary electrode, which is a grid-shaped auxiliary electrode, of the display panel according to embodiment 1 of the disclosure.
Figure 4:
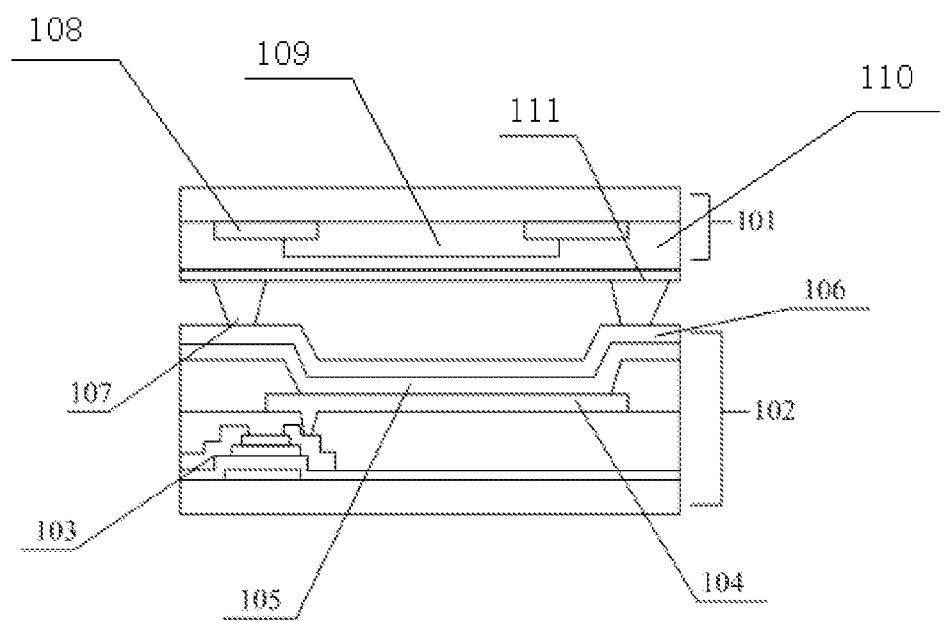
FIG. 4 is another structural diagram of a display panel according to embodiment 1 of the disclosure.

As shown in FIG. 3, the auxiliary electrode 111 is preferably a grid-shaped auxiliary electrode and provided in a non-display region (that is, regions corresponding to the black matrixes 108 on the first substrate 101), and may be preferably made of any one of Al, Mo, Cu, Ag, Cr and Au or combination thereof. Of course, any other conductive material with low resistance is possible, and the thickness of the auxiliary electrode 111 is in a range of 50~300 nm. At this time, the grid-shaped auxiliary electrode 111 is preferably made of opaque conductive material, and in this case, it is possible that no black matrix 108 is provided on the first substrate 101, and the grid-shaped auxiliary electrode 111 acts as the black matrix 108, the resistance of the material of the grid-shaped auxiliary electrode 111 is lower than that of the cathode, which may improve the conductivity of the cathode layer 106. Of course, bar-shaped auxiliary electrodes 111 are also possible and provided in the non-display region, and all of the bar-shaped auxiliary electrodes may be electrically connected to each other through at least one connection stripe.

Preferably, a reflective layer is provided below the anode layer 104 of the organic electroluminescent device, and the reflective layer is used to reflect light emitted from the organic electroluminescent device to the cathode layer 106 of the organic electroluminescent device. Specifically, the reflective layer may be provided on the anode layer 104 of the organic electroluminescent device at a side far away from the first substrate 101, but position of the reflective layer is not limited thereto. The reflective layer may be made of a reflective material, such as Ag and Al. Since light frequently transmits the anode layer 104, by adding the reflective layer, light incident onto the anode layer 104 may be reflected to the cathode layer side, and outgoes from the cathode layer 106 of the organic electroluminescent device, therefore, utilization of the emergent light of the organic electroluminescent device may be increased, and in a case of other conditions being the same, power consumption of the organic electroluminescent device may be reduced.

Preferably, the organic electroluminescent device is an organic electroluminescent device emitting white light. As to the white light-emitting organic electroluminescent device, patterns 109 of red filter, green filter and blue filter are provided on the first substrate 101 at a side close to the second substrate 102, and of course, the organic electroluminescent device may preferably be an organic electroluminescent device emitting red light, green light or blue light.

It should be noted that, in the above description of the present embodiment, in order to better understand the disclosure, description is made by taking the first substrate 101 being a color filter substrate and the second substrate 102 being an array substrate as an example. However, the disclosure is not limited thereto, for example, the organic electroluminescent device may be a colorized organic electroluminescent device, which can emit red light, green light or blue light, at this time, it is unnecessary to manufacture the color filter patterns 109, and the first substrate 101 may be a transparent substrate and assembled with the second substrate 102 to form a display panel.

Embodiment 2

The present embodiment provides a manufacturing method of a display panel, which comprises following steps:

Step 1, forming a pattern including an auxiliary electrode 111 on a light entering surface of a first substrate 101 by a patterning process.

Step 2, forming a pattern including conductive spacers 107 on the auxiliary electrode 111 by a patterning process; and Step 3, assembling the first substrate 101 and a second substrate 102, so that the auxiliary electrode 111 is electrically connected to cathode layers 106 of organic electroluminescent devices through the conductive spacers 107, wherein the cathode layer 106 is a transparent electrode layer.

Specifically, first, black matrixes (BM) are formed on a first base by coating, exposure, development and baking processes and the like, red (R), green (G) and blue (B) color filter patterns 109 are formed above the black matrixes 108 respectively by coating, exposure, development and baking processes and the like, then a planarization layer 110 is coated, and a layer of metal or metal oxide is deposited on the planarization layer 110 by sputtering, Plasma Enhanced Chemical Vapor Deposition (PECVD) method, evaporation or the like and then a patterning process is performed thereon to form a pattern including the auxiliary electrode 111, and conductive spacers 107 are formed above the auxiliary electrode 111 by a patterning process. In a case of the auxiliary electrode 111 being made of a transparent material, it may be plate-shaped or of other shape. In a case of the auxiliary electrode 111 being made of an opaque material, in order to enable light to transmit, the auxiliary electrode 111 is preferably grid-shaped and provided in a non-display region so as to ensure light emitted from the organic electroluminescent devices may transmit the first substrate 101, at this time, it is possible that no black matrix 108 is provided on the first substrate 101. Of course, it is also possible that the auxiliary electrode 111 may be formed as bar-shaped auxiliary electrodes, and all of the bar-shaped auxiliary electrodes are electrically connected together through at least one connection stripe.

The plate-shaped auxiliary electrode 111 is made of any one of indium tin oxide, indium gallium zinc oxide, and indium zinc oxide, or may be made of other transparent conductive material. The grid-shaped auxiliary electrode 111 may be made of any one of aluminium (Al), molybdenum (Mo), copper (Cu), silver (Ag), chrome (Cr) and gold (Au) or combination thereof, of course, material of the plate-shaped auxiliary electrode is not limited thereto, other opaque conductive materials are possible, and the plate-shaped auxiliary electrode may have a thickness of 50-300 nm.

The conductive spacer 107 may be made of a conductive organic material, such as polyacetylene, PPV (Poly-(P-phenylenevinyle)), PTH (polythiophenes), PPP (poly p-phenylene), PPy (polypyrroles), PANI (polyaniline), PEDOT (poly(3,4-ethylenedioxythiophene)) or combination thereof.

Next, a gate is formed on a second base by sputtering, exposure, development, etching, peeling off processes and the like, a gate insulation layer is formed above the gate by a plasma enhanced chemical vapor deposition method and the like, an active layer of oxide semiconductor is formed above the gate insulation layer by sputtering, exposure, development, etching, peeling off processes and the like, an etch stopper layer (ESL) is formed above the active layer by sputtering, exposure, development, etching, peeling off processes and the like, a drain and a source are formed above the etch stopper layer by sputtering, exposure, development, etching, peeling off processes and the like so that the drain and the source are connected to the active layer of oxide semiconductor through contact vias passing through the etch stopper layer, a passivation protection layer is formed above the drain and the source, a pixel electrode layer 104 is formed above the passivation protection layer so that the pixel electrode layer 104 is connected to the drain through a via passing through the passivation protection layer, a pixel defining layer (PDL) is formed above the pixel electrode layer 104 which is the anode layer 104 of the organic electroluminescent device, and a light emitting layer 105 and a cathode layer 106 required for the light emitting layer 105 are evaporated on the pixel electrode layer 104.

The gate may be of a single-layered structure or a multilayered composite laminated structure made of one or more of molybdenum (Mo), alloy of molybdenum and niobium (MoNb), aluminum (Al), alloy of aluminum and neodymium (AlNd), titanium (Ti) and copper (Cu), and preferably is of a single-layered structure or a multilayered composite laminated structure made of Mo, Al or alloy containing Mo and Al. Thickness of the gate is 100 nm~500 nm.

In the present embodiment, the gate insulation layer may be a multilayered composite film made of one or two of silicon oxide (SiOx), silicon nitride (SiNx), hafnium oxide (HfOx), silicon nitrogen oxide (SiON) and aluminum oxide (AlOx), and, and thickness thereof is controlled to be about 100~600 nm and adjustable as desired.

The active layer of oxide semiconductor may be a thin film made of elements including Indium (In), gallium (Ga), zinc (Zn), oxygen (O), stannum (Sn) etc. and is formed by sputtering, wherein the thin film must be made of oxygen element and two or more of the above elements, such as indium gallium zinc oxide (IGZO), indium zinc oxide (IZO), indium tin oxide (InSnO), indium gallium stannum oxide (InGaSnO) and the like. The active layer of oxide semiconductor is preferably made of IGZO and IZO, and thickness thereof is preferably 10~100 nm.

The etch stopper layer may be made of a material, such as SiOx, SiNx, HfOx, SiON, AlOx etc. and may be a multilayered film made of two or three of the above materials.

The source and the drain may be a single-layered structure or a multilayered composite laminated structure made of one or more of Mo, MoNb, Al, AlNd, Ti and Cu, and preferably is of a single-layered film or a multilayered composite film made of Mo, Al or alloy containing Mo and Al.

The passivation protection layer may be made of one of SiOx, SiNx, HfOx, SiON, AlOx and organ materials or combination thereof.

The pixel electrode layer 104, i.e., the anode layer 104 of the organic electroluminescent device, may be made of ITO (indium tin oxide), of course it also may be made of other transparent conductive material. Since the pixel electrode layer 104 is transparent, it is necessary to provide a reflective layer under the anode layer 104 to reflect light emitted from the organic electroluminescent device to the cathode layer 106 side, and the reflective layer may be made of a reflective metal material such as Ag.

The pixel defining layer may be an organic insulating layer with lower moisture and has photosensitive property similar to that of the common photoresist.

The light emitting layer 105 is made of an organ material, which is determined as desired.

The cathode layer 106 may be made of a metal material with low work function, such as Al or Ag, and is thin enough to enable light to transmit.

Finally, the resultant first substrate 101 and the resultant second substrate 102 are encapsulated to form a display panel.

It should be noted that, there is no sequencing for manufacturing the first substrate 101 and manufacturing the auxiliary electrode 111 and the conductive spacers 107 on the first substrate 101, and manufacturing the second substrate 102 (including the thin film transistors 103 and the organic electroluminescent devices thereon), the above description is just an example, and it is also possible to first manufacture the second substrate 102, then manufacture the first substrate 101 and manufacture the auxiliary electrode 111 and the conductive spacers 107 on the first substrate 101.

In the display panel manufactured by the manufacturing method provided by the present embodiment, the cathode layer 106 thereof is connected to the auxiliary electrode 111 through the conductive spacers 107, and the conductivity of the cathode layer 106 is improved significantly, and thus the luminance uniformity of the display panel is improved.

It should be noted that, in the present embodiment, the first substrate 101 is a color filter substrate, and the second substrate 102 is an array substrate, but the disclosure is not limited thereto. For example, when the manufactured organic electroluminescent device is a colorized organic electroluminescent device which may emit red light, green light or blue light, it is unnecessary to manufacture color filter patterns 109, and at this time, the first substrate 101 may be a transparent substrate, and a display panel may be formed by assembling the first substrate 101 and the second substrate 102. The above structures may be set as desired.

Embodiment 3

The present embodiment provides a manufacturing method of a display panel, which comprises following steps:

Step 1, forming a pattern including an auxiliary electrode on a light entering surface of a first substrate 101 by a patterning process.

Step 2, forming a pattern including conductive spacers 107 on a cathode layer 106 of a second substrate 102 at positions corresponding to the auxiliary electrode 111 by a patterning process.

Step 3, assembling the first substrate 101 and a second substrate 102, so that the auxiliary electrode 111 is electrically connected to the cathode layer 106 of the organic electroluminescent device through the conductive spacers 107, wherein the cathode layer 106 is a transparent electrode layer.

It should be noted that, the sequence of the step 1 and the step 2 may be reversed, that is to say, it is also possible to form the conductive spacers 107 on the cathode layer 106 of the second substrate 102 first, then form the auxiliary electrode 111 on a light entering surface of a first substrate 101 at positions corresponding to the conductive spacers 107.

In the manufacturing method of a display panel provide by the present embodiment, the conductive spacers 107 are provided on the second substrate 102, other procedures are the same as those in the manufacturing method of a display panel provide by the embodiment 1, and will not be repeatedly described herein.

In the display panel manufactured by the manufacturing method provided by the present embodiment, the cathode layer thereof is connected to the auxiliary electrode 111 through the conductive spacers 107, the conductivity of the cathode layer 106 is improved remarkably, and thus the luminance uniformity of the display panel is improved.

Embodiment 4

As shown in FIG. 5, the present embodiment provides a manufacturing method of a display panel, which comprises following steps:

Step 1, forming a pattern including an auxiliary electrode on a light entering surface of a first substrate 101 by a patterning process, and forming a pattern including first conductive spacers 1071 on the auxiliary electrode 111 by a patterning process.

Step 2, forming a pattern including second conductive spacers 1072 on a cathode layer 106 of a second substrate 102 at positions corresponding to the first conductive spacers 1071 by a patterning process.

Step 3, assembling the first substrate 101 and a second substrate 102, so that the auxiliary electrode 111 is electrically connected to the cathode layers 106 of the organic electroluminescent device through the first conductive spacers 1071 and the second conductive spacers 1072, wherein the cathode layer 106 is a transparent electrode layer. A display panel as shown in FIG. 5 is obtained.

It should be noted that, the sequence of the step 1 and the step 2 may be reversed, that is to say, it is also possible to form the second conductive spacers 1072 on the second substrate 102 first, and then form the first conductive spacers 1071 above the auxiliary electrode 111 on the light entering surface of the first substrate 101 at positions corresponding to the second conductive spacers 1072.

In the manufacturing method of a display panel provide by the present embodiment, the conductive spacer 107 is divided into a first conductive spacer 1071 and a second conductive spacer 1072, which are manufactured on the first substrate 101 and the second substrate 102 respectively, at this time, compared to the height of the conductive spacer 107 in the embodiment 1 or 2, the height of the first conductive spacer 1071 or the second conductive spacer 1072 in the present embodiment is lower, thus the first conductive spacer 1071 and the second conductive spacer 1072 are easy to be manufactured. One of the first conductive spacer 1071 and the second conductive spacer 1072 is wider than the other one, that is, the surface area of an end of one of the first conductive spacer 1071 and the second conductive spacer 1072 towards the other one of the first conductive spacer 1071 and the second conductive spacer 1072 is larger than that of an end of the other one towards the one, so that the first substrate 101 and the second substrate 102 are assembled more stably. Other manufacturing procedures of the manufacturing method of the present embodiment are the same as those in the embodiment 1, and will not be repeatedly described herein. Of course, in the present embodiment, the first conductive spacer 1071 and the second conductive spacer 1072 may also be manufactured on the first substrate 101 and the second substrate 102 respectively, and manufacturing procedures thereof are the same as the above case in the present embodiment, and will not be repeatedly described herein.

In the display panel manufactured by the manufacturing method provided by the present embodiment, the cathode layer 106 thereof is connected to the auxiliary electrode 111 through the first conductive spacers 1071 and the second conductive spacers 1072, the conductivity of the cathode layer 106 is improved significantly, and thus the luminance uniformity of the display panel is improved.

Embodiment 5

The present embodiment provides a display device comprising the display panel of the embodiment 1. The display device may be any product or component with display function, such as a mobile phone, a tablet computer, a TV, a display, a notebook computer, a digital image frame, a navigator.

In the display device comprising the display panel of the embodiment 1, the cathode layer thereof is connected to the auxiliary electrode 111 through the conductive spacers 107, the conductivity of the cathode layer 106 is improved significantly, the luminance uniformity of the display panel is improved, and thus the display effect of the display device is excellent.

Of course, the display device of the present embodiment may further comprise other conventional structures, such as a power supply unit, a display driving unit and the like.

It should be understood that, the above embodiments are only exemplary embodiments employed to illustrate the principle of the disclosure, and the disclosure is not limited thereto. Persons skilled in the art can make various modifications and improvements without departing from the principle and substance of the disclosure, and these modifications and improvements should be considered to be within the protection scope of the disclosure.

The invention claimed is:

1. A display panel, comprising:
   an organic electroluminescent device comprising an anode layer and a cathode layer;
   an auxiliary electrode electrically arranged on a side of the cathode layer away from the anode layer and connected to the cathode layer through a plurality of conductive spacers, the plurality of conductive spacers are spaced from each other, and the cathode layer is a transparent electrode layer; and
   the auxiliary electrode has a resistance smaller than that of the cathode layer of the organic electroluminescent device;

wherein the auxiliary electrode is a grid-shaped auxiliary electrode and is provided in a non-display region, and the auxiliary electrode is opaque and acts as a black matrix, and wherein the plurality of conductive spacers comprises first conductive spacers provided on the auxiliary electrode and second conductive spacers provided on the cathode layer, and a thickness of the auxiliary electrode is in a range of 50-300 nm.

2. The display panel of claim 1, wherein the grid-shaped auxiliary electrode is made of any one of Al, Mo, Cu, Ag, Cr and Au or a combination thereof.

3. The display panel of claim 1, wherein the spacer is made of any one of polyacetylene, PPV, polythiophene, poly p-phenylene, polypyrrole, polyaniline, poly(3,4-ethylenedioxythiophene) or combination thereof.

4. The display panel of claim 1, wherein a surface area of an end of the first conductive spacer facing the second conductive spacer is larger than that of an end of the second conductive spacer facing the first conductive spacer.

5. The display panel of claim 1, wherein a surface area of an end of the first conductive spacer towards the second conductive spacer is smaller than that of an end of the second conductive spacer towards the first conductive spacer.

6. The display panel of claim 1, wherein a reflective layer is provided below the anode layer of the organic electroluminescent device, and the reflective layer is used to reflect light emitted from the organic electroluminescent device to the cathode layer of the organic electroluminescent device.

7. The display panel of claim 1, wherein the organic electroluminescent device is an organic electroluminescent device emitting white light.

8. The display panel of claim 7, further comprising: red filter patterns, green filter patterns and blue filter patterns spaced at certain intervals, wherein the red filter patterns, the green filter patterns and the blue filter patterns are located on a side of the auxiliary electrode away from the cathode layer.

9. The display panel of claim 1, wherein the organic electroluminescent device includes an organic electroluminescent device emitting red light, green light or blue light.

10. A display panel, comprising:
an organic electroluminescent device comprising an anode layer and a cathode layer;
an auxiliary electrode electrically arranged on a side of the cathode layer away from the anode layer and connected to the cathode layer through a plurality of conductive spacers, the plurality of conductive spacers are spaced from each other, and the cathode layer is a transparent electrode layer; and the auxiliary electrode has a resistance smaller than that of the cathode layer of the organic electroluminescent device;

wherein the auxiliary electrode comprises a plurality of bar-shaped auxiliary electrodes connected to each other through at least one connection stripe, and wherein the plurality of conductive spacers comprises first conductive spacers provided on the auxiliary electrode and second conductive spacers provided on the cathode layer; and a thickness of the auxiliary electrode is in a range of 50-300 nm.

11. The display panel of claim 10, wherein the bar-shaped auxiliary electrode is made of any one of Al, Mo, Cu, Ag, Cr and Au or a combination thereof.

12. The display panel of claim 10, wherein the spacer is made of any one of polyacetylene, PPV, polythiophene, poly p-phenylene, polypyrrole, polyaniline, poly(3,4-ethylenedioxythiophene) or combination thereof.

13. The display panel of claim 10, wherein a surface area of an end of the first conductive spacer facing the second conductive spacer is larger than that of an end of the second conductive spacer facing the first conductive spacer.

14. The display panel of claim 10, wherein a surface area of an end of the first conductive spacer towards the second conductive spacer is smaller than that of an end of the second conductive spacer towards the first conductive spacer.

15. The display panel of claim 10, wherein a reflective layer is provided below the anode layer of the organic electroluminescent device, and the reflective layer is used to reflect light emitted from the organic electroluminescent device to the cathode layer of the organic electroluminescent device.

16. The display panel of claim 10, wherein the organic electroluminescent device is an organic electroluminescent device emitting white light.

17. The display panel of claim 16, further comprising: red filter patterns, green filter patterns and blue filter patterns spaced at certain intervals, wherein the red filter patterns, the green filter patterns and the blue filter patterns are located on a side of the auxiliary electrode away from the cathode layer.

18. The display panel of claim 10, wherein the organic electroluminescent device includes an organic electroluminescent device emitting red light, green light or blue light.

19. A display device comprising the display panel of claim 1.

20. A display device comprising the display panel of claim 10.

* * * * *